(12) United States Patent
Kim

(10) Patent No.: US 9,698,817 B2
(45) Date of Patent: Jul. 4, 2017

(54) APPARATUSES AND METHODS FOR DATA COMPRESSION AND FOR DATA RECOVERY IN DIGITAL BASEBAND TRANSMISSION SYSTEM

(71) Applicant: ELECTRONICS AND TELECOMMUNICATIONS RESEARCH INSTITUTE, Daejeon-si (KR)

(72) Inventor: Seung Hwan Kim, Daejeon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/007,763

(22) Filed: Jan. 27, 2016

(65) Prior Publication Data

US 2016/0218738 A1 Jul. 28, 2016

(30) Foreign Application Priority Data

Jan. 28, 2015 (KR) .................. 10-2015-0013779

(51) Int. Cl.
*H03M 7/30* (2006.01)
*H04L 25/02* (2006.01)
*H03M 7/50* (2006.01)

(52) U.S. Cl.
CPC .......... *H03M 7/30* (2013.01); *H03M 7/3059* (2013.01); *H03M 7/50* (2013.01); *H04L 25/028* (2013.01)

(58) Field of Classification Search
CPC ........ H03M 7/30; H03M 7/3059; H03M 7/50; H04L 25/028
See application file for complete search history.

(56) References Cited

U.S. PATENT DOCUMENTS

| | | | |
|---|---|---|---|
| 7,899,262 B2 | 3/2011 | Sugita | |
| 8,331,461 B2 | 12/2012 | Wegener | |
| 8,842,724 B1 | 9/2014 | Joung et al. | |
| 2005/0187433 A1* | 8/2005 | Horn | A61B 1/04 600/160 |
| 2009/0073006 A1* | 3/2009 | Wegener | G10L 19/24 341/61 |
| 2009/0251477 A1* | 10/2009 | Su | G09G 3/3611 345/547 |
| 2011/0026593 A1* | 2/2011 | New | H03M 7/42 375/240.12 |
| 2014/0376605 A1 | 12/2014 | Kim et al. | |

FOREIGN PATENT DOCUMENTS

| | | |
|---|---|---|
| KR | 10-1410249 B1 | 6/2014 |
| KR | 20150000820 A | 1/2015 |

* cited by examiner

*Primary Examiner* — Freshteh N Aghdam
(74) *Attorney, Agent, or Firm* — Ladas & Parry LLP

(57) ABSTRACT

A data compression apparatus and a data recovery apparatus for a digital baseband transmission system. The data compression apparatus includes compressor A configured to generate a first compression signal through up-down sampling an input signal; and compressor B configured to generate a second compression signal through partial bit sampling whereby at least one least-significant bit is eliminated from the first compression signal.

16 Claims, 6 Drawing Sheets

APPARATUSES AND METHODS FOR DATA COMPRESSION AND FOR DATA RECOVERY IN DIGITAL BASEBAND TRANSMISSION SYSTEM

CROSS-REFERENCE TO RELATED APPLICATION(S)

This application claims priority from Korean Patent Application No. 10-2015-0013779, filed on Jan. 28, 2015, in the Korean Intellectual Property Office, the disclosure of which is incorporated herein by reference in its entirety.

BACKGROUND

1. Field

The following description relates to a network transmission technology, and more specifically, to a base-band transmission technology.

2. Description of the Related Art

Communication service operators worldwide require more distributed base stations in order to process the exponentially increasing data traffic. The Common Public Radio Interface (CPRI) is a digital interface to be used for processing data traffic, for which defined standard specifications only support up to 10 Gbps of bandwidth and thus cannot meet the requirements for processing bandwidth of several tens of Gbps.

To address such a problem, standardization of CPRI in-phase/quadrature (IQ) data compression technologies is in progress, and plans for system application have been announced. Future mobile communication technologies will require a greater number of downsized base stations, and the need for digital interfaces will continue to increase to accommodate the increasing number of base stations. Also, it is predicted that the need for new technologies will continue to increase in the field of data compression in light of such growing demand.

KDDI, a Japanese company, and ALU, a U.S. company, have proposed compression algorithms for the Common Public Radio Interface (CPRI) specifications that specify transmission of distributed base stations. The aforesaid compression algorithms both utilize up-down sampling (generally used as decimation) to compress IQ data elements so that data that is meaningful in the frequency domain can be compressed into a narrower bandwidth. Furthermore, if nonlinear quantization processing (suggested by KDDI) and block-scaling processing (suggested by ALU) are carried out, the efficiency of data compression and recovery may be increased.

The aforesaid compression and recovery technologies can reduce an error vector magnitude loss, as well as reduce latency caused by compression and recovery within, for example, 20 sec. However, it still has limitations in terms of compression rate.

SUMMARY

In one general aspect, there is provided a data compression apparatus including: compressor A configured to generate a first compression signal through up-down sampling an input signal; and compressor B configured to generate a second compression signal through partial bit sampling whereby at least one least-significant bit is eliminated from the first compression signal.

A total compression rate by both compressors A and B may be Up-down sampling factor×(Valid transmission bits (n)/Total transmission bits (m))×100 (m>n; m and n are integers)

A data compression rate of compressor A that compresses the input signal by up-sampling and down-sampling may be ⅔ or greater.

The data compression apparatus may further include a converter configured to convert the first compression signal into a binary signal and transmit the binary signal to compressor B.

In another general aspect, there is provided a data recovery apparatus including: recovery part A configured to generate a first recovery signal by recovering a compression signal, which is generated from an original signal through partial bit sampling and from which at least one least significant bit is eliminated from the original signal; and recovery part B configured to generate a second recovery signal by down-up sampling the first recovery signal, wherein the second recovery signal is the original input signal.

Recovery part A may generate the first recovery signal by filling in a least-significant-bit sequence that was eliminated during partial bit sampling.

Recovery part A may fill in the least-significant-bit sequence with "0"s and "1"s such that the numbers of "0"s and "1"s are the same or a difference between the numbers of "0"s and "1"s becomes 1.

The data recovery apparatus may further include an inverter configured to convert the first recovery signal into an analog signal and transmit the analog signal to recovery part B.

In yet another general aspect, there is provided a digital baseband transmission system including: a transmission apparatus configured to generate a first compression signal by up-down sampling an input signal, generate a second compression signal through partial bit sampling, and transmit the second compression signal; and a receiving apparatus configured to generate a first recovery signal by restoring the second compression signal transmitted from the transmission apparatus and to generate a second recovery signal, which is an original input signal, by down-up sampling the first recovery signal.

The receiving apparatus may generate the first recovery signal by filling in a least-significant-bit sequence that was eliminated during partial bit sampling.

Other features and aspects will be apparent from the following detailed description, the drawings, and the claims.

Figure 1:
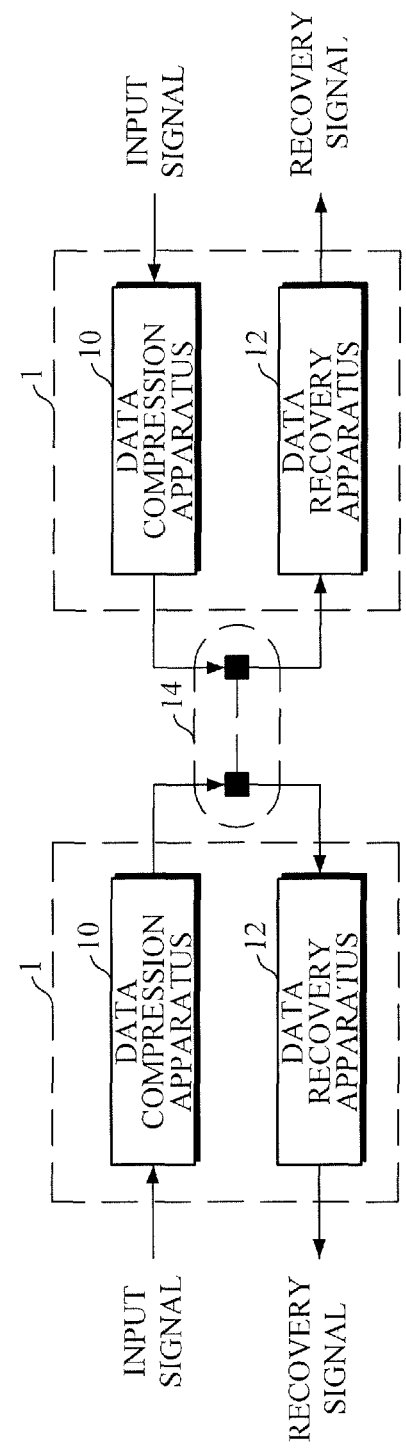
FIG. 1 is a diagram illustrating a configuration of a digital baseband transmission system according to an exemplary embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

In compression technologies proposed by KDDI and ALU, algorithms are commonly applied to up-down sampling mechanisms and data bit compression/recovery process. A specific length of extra time needs to be considered in consideration of latency, and an upper limit of a compression rate is restricted to 50%. Especially, some communication service operators that require a much shorter latency time than that suggested by the standard specification may find the aforesaid technologies inefficient to use.

According to the present disclosure, high compressibility and shorter latency can be achieved by simultaneously using both up-down sampling and partial-bit-sampling. All digital baseband communications allow a certain amount of error vector magnitude (EVM). For example, EVM is allowed up to 8% in a 64-quadrature amplitude modulation (QAM)/20 MHz band. The present disclosure is based on the fact that when data from which some least significant bits were eliminated is received, the data can be recovered if EVM thereof is within a certain error tolerance. Hereinafter, data compression and recovery technologies with the aforesaid features will be described in detail with reference to the accompanying drawings.

FIG. 1 is a diagram illustrating a configuration of a digital baseband transmission system according to an exemplary embodiment.

Referring to FIG. 1, in the digital baseband transmission system 1, a data compression and recovery interface includes a transmission apparatus and a receiving apparatus. The transmission apparatus may coincide with a data compression apparatus 10 or may include the data compression apparatus 10. The receiving apparatus may coincide with a data recovery apparatus 12 or may include the data recovery apparatus 12. The transmission apparatus and the receiving apparatus both may have the same symmetrical structure.

The data compression apparatus 10 receives an input signal and compresses it. The input signal is an original signal which has not yet undergone data compression. For example, the input signal may be in-phase/quadrature (IQ) data of baseband. The IQ data consists of in-phase components and quadrature Q components, and may be represented as integer data or binary data. The input signal may refer to the entire transmission frame defined in various transmission fields or a particular field value in a transmission frame. Specifics of the data compression apparatus 10 will be described below with reference to FIG. 2.

The data recovery apparatus 12 recovers the received compressed data to reproduce the original signal. A signal recovered by the data recovery apparatus 12 can have the characteristics of the original signal, and may be a signal that is recoverable when being received within a given permissible EVM loss range. The specifics of the data recovery apparatus 12 will be described below with reference to FIG. 4.

Wired/wireless media 14 are provided between the data compression apparatus 10 and the data recovery apparatus 12. The wired/wireless media 14 include any types of media usable in the digital baseband transmission system 1. For example, the wired media may include optical cables, coaxial cables and the like, and the wireless media may include all interfaces and wireless interfaces between base stations, between a base station and a central office, between a base station and a terminal, and between a central office and a terminal.

Figure 2:
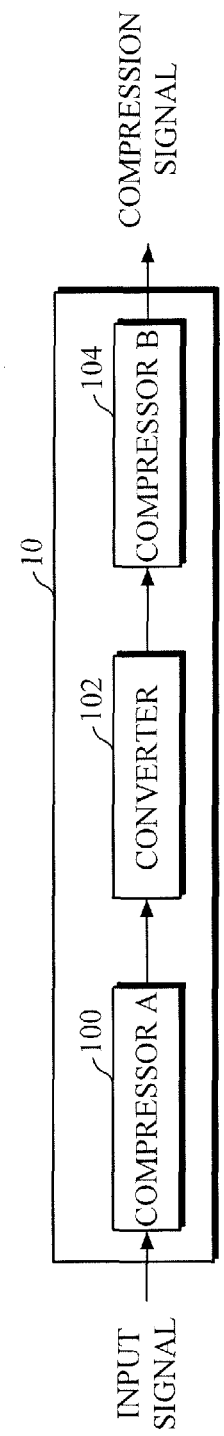
FIG. 2 is a diagram illustrating in detail the data compression apparatus according to an exemplary embodiment.

FIG. 2 is a diagram illustrating in detail the data compression apparatus according to an exemplary embodiment.

Referring to FIG. 2, the data compression apparatus 10 includes compressor A 100, a converter 102, and compressor B 104.

Compressor A 100 is a block to detect and compress valid data, performing up-down sampling. At this time, compressor A 100 up-samples an IQ-based analog input signal and then down-samples the resulting signal, thereby eliminating unnecessary data elements from within the permissible EVM loss range.

The converter 102 converts IQ data in the form of an integer into an m-bit binary signal. m is a number around 15 in the case of LTE, but aspects of the present disclosure are not limited thereto.

Compressor B 104 is a block to compress the signal through partial-bit sampling, for which compressor B 104 eliminates n number of least significant bits from an incoming m-bit data sequence.

Figure 3:
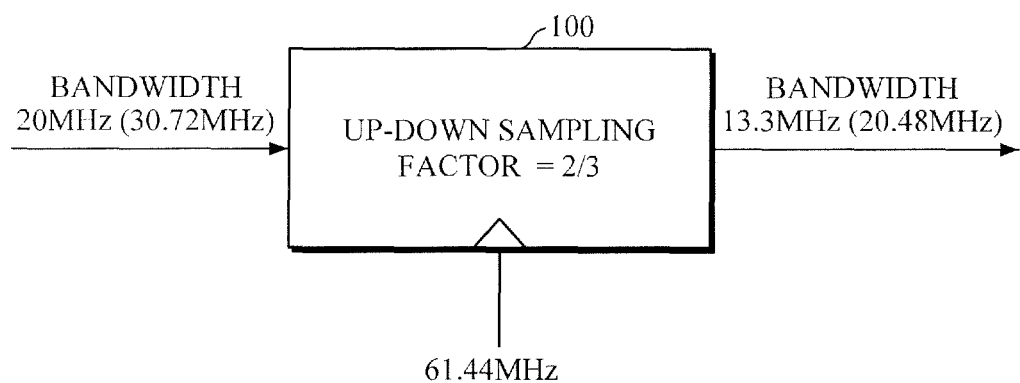
FIG. 3 is a diagram illustrating an example of up-down sampling for LTE in-phase/quadrature (IQ) data transmission according to an exemplary embodiment.

FIG. 3 is a diagram illustrating an example of up-down sampling for LTE IQ data transmission according to an exemplary embodiment.

Referring to FIGS. 2 and 3, compressor A 100 up-samples and down-samples an IQ-based analog input signal to eliminate unnecessary data elements from within a permissible EVM loss range. For example, in the case of an LTE service, as shown in FIG. 3, an LTE signal of 20 MHz may be upsampled to 30.72 MHz in accordance with the CPRI standardization, and, thereafter, be down-sampled again to 20.48 MHz, whereby the LTE signal can be transmitted after being compressed down to two-thirds of its original bandwidth of 30.72 MHz.

Figure 4:
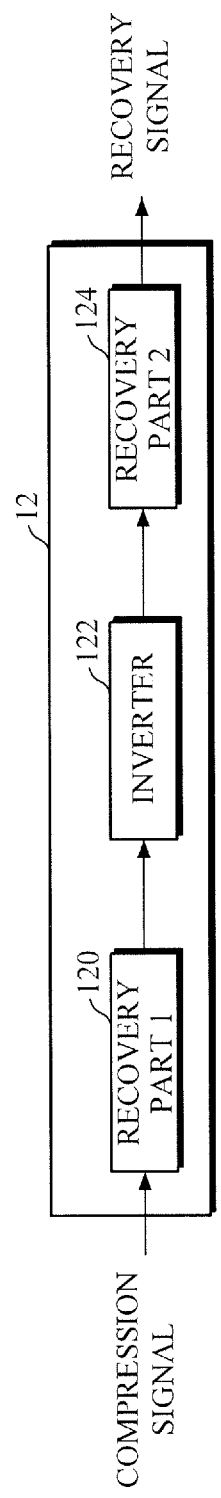
FIG. 4 is a diagram illustrating in detail the data recovery apparatus according to an exemplary embodiment.

FIG. 4 is a diagram illustrating in detail the data recovery apparatus according to an exemplary embodiment.

Referring to FIG. 4, the data recovery apparatus 12 includes recovery part A 120, an inverter 122, and recovery part B 124.

The recovery part A 120 receives, as an input signal, compressed data through the wired/wireless medium from the data compression apparatus that has compressed an original signal. Since the size of the data changes due to noise and distortion occurring in a transmission channel during the wired or wireless data transmission, the compressed data is equalized and then recovered through partial bit sampling.

The recovery part A 120, according to the exemplary embodiment, generates a first recovery signal by recovering bit sequences that was eliminated during the transmission. It is possible for the eliminated least-significant-bit sequence to be mapped with any value consisting of "1"s and/or "0"s. In this case, by taking into consideration a Gaussian distribution of a general signal, almost half of the bit sequence is filled with "0"s and "1"s so that a final error vector magnitude loss can be minimized. That is, in the case of 6 bits, a value of "101010" may be used; in the case of 5 bits, a value of "101010" or "10101" may be used.

The inverter 122 inverts first recovery signal, which is of binary form, into an analog signal of integer form.

Recovery part B 124 is a block to perform inversion of compressor A 100 of the data compression apparatus 10, which is described above with reference to FIG. 2, for which the recovery part B 124 generates a second recovery signal by time sequentially performing down-sampling and up-sampling.

Figure 5:
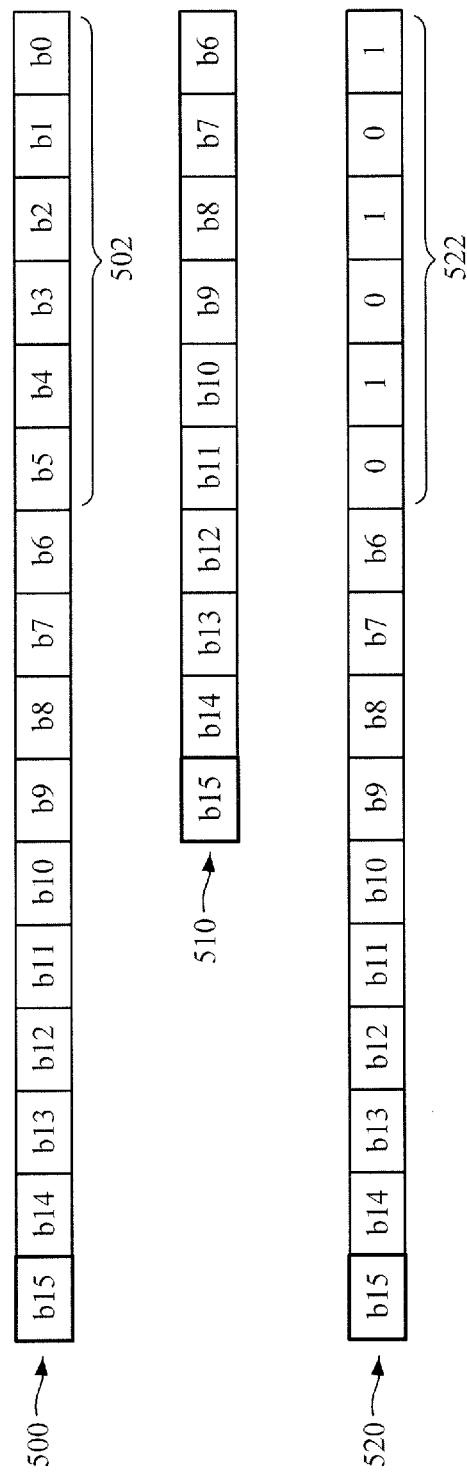
FIG. 5 illustrates bits during partial bit sampling compression and original data recovery according to an exemplary embodiment.

FIG. 5 illustrates bits during partial bit sampling compression and original data recovery according to an exemplary embodiment.

Referring to FIG. 5, the data compression apparatus generates compression data 510 by compressing data that has an eliminable least-significant-bit sequence through partial bit sampling. Since the compression data 510 is generated by eliminating a least-significant-bit sequence 502 from original data 500, the compression data 510 has a much smaller amount of data than the original data 500. A compression rate may be represented by Equation 1 as below. In the case of an applicable LTE signal, under the assumption that the up-down sampling factor is $2/3$ and only 10-bit sequence out of a 16-bit sequence is transmitted through partial bit sampling, the total compression rate becomes 41.7%. This means that with only 41.7% of the entire data, the compression-recovery transmission is possible.

$$\text{Total compression rate (\%)} = \text{Up-down sampling factor} \times (\text{Valid transmission bits } (n)/\text{Total transmission bits } (m)) \times 100 (m>n) \quad (1)$$

$$41.7(\%) = 0.667 \times (10/16) \times 100 \quad (2)$$

In Equation 2, an up-down sampling factor is $2/3$, $m$ is 16, and $n$ is 10.

The partial bit sampling compression rate may vary according to the total compression rate. For example, if the up-down sampling factor were $2/3$ and the total compression rate were 50%, the partial bit sampling compression rate would be $3/4$. In this case, if a 4-bit sequence were eliminated from a 16-bit sequence and only 12-bit sequence were transmitted in order to make the partial bit sampling compression rate be $3/4$, the total compression rate would become 50%. However, the aforesaid exemplary embodiment is provided only for purpose of example and aspects of the present disclosure are not limited thereto. Recovery data 520 is data recovered by the data recovery apparatus, and a least-significant-bit sequence 522 thereof is filled with "0"s or "1"s.

Figure 6:
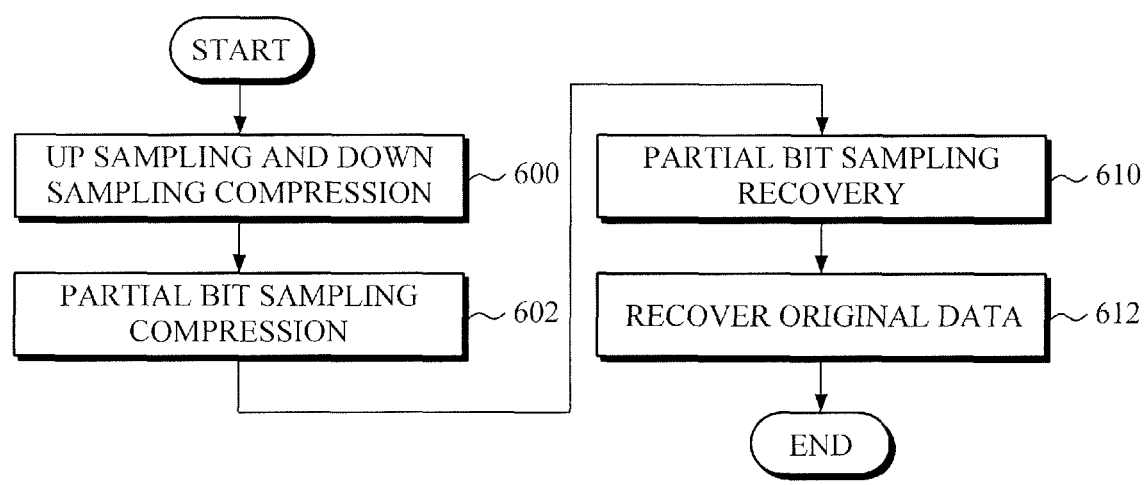
FIG. 6 is a flowchart illustrating a data compression and recovery method according to an exemplary embodiment.

FIG. 6 is a flowchart illustrating a data compression and recovery method according to an exemplary embodiment.

Referring to FIG. 6, a data compression apparatus generates a first compression signal by up-sampling and down-sampling an input signal, as depicted in 600. Then, the data compression apparatus generates a second compression signal by performing partial bit sampling whereby least significant bits are eliminated from the first compression signal, as depicted in 602. Then, the data compression apparatus transmits the generated second compression signal to a data recovery apparatus.

In 610, the data recovery apparatus receives the compression signal from the data compression apparatus, and generates a first recovery signal by filling in a bit sequence that was eliminated during the partial bit sampling compression. Then, the data recovery apparatus recovers original data by down-sampling and up-sampling the first recovery signal, as depicted in 612.

According to the above exemplary embodiments, by using up-down sampling and partial bit sampling mechanisms, baseband data can be compressed to the maximum, so that a capital expenditure (CAPEX) and an operational expenditure (OPEX) due to additional networks built to address the exponential increase in wireless data traffic can be drastically reduced. If the apparatus and method described in the present disclosure were to be implemented in the digital unit (DU)-radio unit (RU) distributed base station market, or possible "next-generation" mobile communication market, or more specifically, in the market where a digital interface consists of 'a central office and a personal terminal' or of 'a base station and a personal terminal', the CAPEX and OPEX of communication service operators could be drastically reduced. The technology specified in the present disclosure is expected to be developed so as to be beneficial to all communication service operators, communication equipment manufacturers, content and service providers, and customers.

In particular, in light of the future development of the optical transmission and mobile communication system and in consideration of the possibility that the currently used 64-QAM scheme will evolve into a 256-or-greater-QAM scheme, the number of bits (approximately 15 bits) for digital quantization is more likely to increase, and in this case, the effect of partial bit sampling proposed by the present disclosure may be maximized.

What has been described above is the background of the present invention along with examples of its application in in-phase/quadrature (I/Q) data that follows transmission protocols between distributed wireless base station devices. However, the application of the present invention is not limited to distributed wireless base stations but may be applied to other areas in the field of network communications (e.g., access networks or backbone networks). Alternatively, as a network transmission medium, the present invention may be applied to a wired system, a wireless system, a coaxial cable system, or a wired/wireless mixing system. Alternatively, the present invention may be applied to a network device as a multiplexing system in which time division, frequency division, wavelength division, code division, Orthogonal Frequency-Division Multiple Access (OFDMA), etc. are applied. As a network device, the present invention may be applied to a router, switch, and terminal, or to satellite communications, fixed wireless communications, and wireless mobile communications systems. Furthermore, the present invention may be widely applied to the hardware or software of various communications systems that need to be able to conduct compression and recovery to the data they intend to transmit.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:
1. A data compression apparatus comprising:
a first compressor configured to generate a first compression signal through up-down sampling an input signal; and
a converter configured to convert the first compression signal into a first m bit long binary signal; and a second compressor configured to generate a m-n bit long binary signal through partial bit sampling the first m bit long binary signal by eliminating n number of least significant bits (LSBs) from the first m bit long binary signal and by assigning correspondingly values of most significant bits (MSBs) from the first m-bit long binary signal into MSBs of the m-n bit long binary signal, wherein m>n and m and n are integers, wherein a total compression rate by both the first compressor and the converter is equal to an Up-down sampling factor×(n/m)×100.

2. The data compression apparatus of claim 1, wherein a data compression rate of the first compressor that compresses the input signal by up-sampling and down-sampling is ⅔ or greater.

3. The data compression apparatus of claim 1, further comprising:

the second compressor configured to output the m-n bit long binary signal.

4. A data recovery apparatus comprising:

a first recovery part configured to receive an m-n bit long binary signal and configured to generate a second m bit long binary signal from the m-n bit long binary signal through partial bit sampling by assigning correspondingly values of most significant bits (MSBs) from the m-n bit long binary signal into MSBs of the second m bit long binary signal, wherein m>n and m and n are integers;

an inverter configured to generate a first recovery analog signal from the second m-bit long binary signal; and a second recovery part configured to generate a second recovery analog signal by down-up sampling the first recovery analog signal.

5. The data recovery apparatus of claim 4, wherein the first recovery part generates the second m bit long binary signal by filling in values into least significant bits (LSBs) in the second m-bit long binary signal.

6. The data recovery apparatus of claim 5, wherein the first recovery part fills in "0" and "1" values into the LSBs in the second m-bit long binary signal to minimize a magnitude loss in a final error vector.

7. The data recovery apparatus of claim 4, wherein the first recovery part fills in "0" and "1" values into the LSBs of the second m-bit long binary signal such that half of the values into the LSBs of the second m-bit long binary signal are "0"s and half of the values into the LSBs of the second m-bit long binary signal are "1"s.

8. A digital baseband transmission system comprising:

a data compression apparatus comprising:

a first compressor configured to generate a first compression signal through up-down sampling an input signal;

a converter configured to convert the first compression signal into a first m bit long binary signal; and a second compressor configured to generate a m-n bit long binary signal through partial bit sampling the first m bit long binary signal by eliminating n number of least significant bits (LSBs) from the first m bit long binary signal and by assigning values of most significant bits (MSBs) from the first m-bit long binary signal into correspondingly MSBs of the m-n bit long binary signal, wherein m>n and m and n are integers; and a data recovery apparatus comprising:

a first recovery part configured to receive the m-n bit long binary signal and configured to generate a second m bit long binary signal from the m-n bit long binary signal through partial bit sampling by assigning values of MSBs from the m-n bit long binary signal into corresponding MSBs of the second m bit long binary signal;

an inverter configured to generate a first recovery analog signal from the second m-bit long binary signal; and a second recovery part configured to generate a second recovery analog signal by down-up sampling the first analog recovery signal.

9. The digital baseband transmission system of claim 8, wherein the first recovery part generates the second m-bit long binary signal by filling in "0" and "1" values into least significant bits (LSBs) in the second m bit long binary signal.

10. The digital baseband transmission system of claim 8, wherein the first recovery part fills in "0" and "1" values into the LSBs in the second m bit long binary signal to minimize a magnitude loss in a final error vector.

11. The digital baseband transmission system of claim 8, wherein the first recovery part fills in "0" and "1" values into the LSBs of the second m bit long binary signal such that half of the values into the LSBs of the second m bit long binary signal are "0"s and half of the values into the LSBs of the second m bit long binary signal are "1"s.

12. The digital baseband transmission system of claim 8, wherein the first compressor up-samples the input signal and eliminates data elements in accordance to an EVM (Error Vector Magnitude) loss range and then down-samples the first compression signal.

13. The digital baseband transmission system of claim 8, wherein the input signal is an in-phase/quadrature (IQ) input signal comprising in-phase components and quadrature components.

14. The digital baseband transmission system of claim 8, wherein the second recovery analog signal is an in-phase/quadrature (IQ) signal.

15. The digital baseband transmission system of claim 8, wherein a total compression rate by both the first compressor and the converter is equal to an (Up-down sampling factor)×(n/m)×100.

16. The digital baseband transmission system of claim 8, wherein a data compression rate of the first compressor that compresses the data input signal by up-sampling is ⅔ or greater.

* * * * *